United States Patent
Murata

(10) Patent No.: US 7,879,169 B2
(45) Date of Patent: Feb. 1, 2011

(54) METHOD FOR PRODUCING CERAMIC COMPACT

(75) Inventor: Takaki Murata, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/254,918

(22) Filed: Oct. 21, 2008

(65) Prior Publication Data

US 2009/0032168 A1    Feb. 5, 2009

Related U.S. Application Data

(63) Continuation of application No. PCT/JP2007/064542, filed on Jul. 25, 2007.

(30) Foreign Application Priority Data

Aug. 18, 2006    (JP)    ............... 2006-223559

(51) Int. Cl.
  C04B 33/34    (2006.01)
  C03B 29/00    (2006.01)
(52) U.S. Cl. ............... 156/89.25; 156/89.11; 156/89.12
(58) Field of Classification Search ............ 156/89.11, 156/89.12, 89.25
See application file for complete search history.

(56) References Cited

U.S. PATENT DOCUMENTS

| | | | |
|---|---|---|---|
| 4,642,148 A * | 2/1987 | Kurihara et al. ......... | 156/89.18 |
| 4,756,959 A * | 7/1988 | Ito et al. ............... | 428/323 |
| 5,139,975 A * | 8/1992 | Herron et al. .......... | 501/7 |
| 5,254,191 A * | 10/1993 | Mikeska et al. ........ | 156/89.15 |
| 2002/0029838 A1 * | 3/2002 | Kawakami ............. | 156/89.12 |
| 2004/0159390 A1 | 8/2004 | Lautzenhiser et al. | |

(Continued)

FOREIGN PATENT DOCUMENTS

EP    0 479 219 A1    4/1992

(Continued)

OTHER PUBLICATIONS

Official Communication issued in International Patent Application No. PCT/JP2007/064542, mailed on Sep. 18, 2007.

(Continued)

Primary Examiner—Philip C Tucker
Assistant Examiner—Alex Efta
(74) Attorney, Agent, or Firm—Keating & Bennett, LLP

(57) ABSTRACT

A method for producing a ceramic compact includes a laminate-preparing step of preparing an unfired laminate including a base layer including a ceramic powder and a glass material and a constraining layer that is in contact with at least one principal surface of the base layer and that primarily includes a burnable material which does not burn off when the burnable material is fired in a low-oxygen atmosphere but which burns off when the burnable material is fired at an oxygen partial pressure greater than that of the low-oxygen atmosphere, and a firing step of firing the unfired laminate to sinter the base layer. The firing step includes a first firing sub-step of firing the laminate including the constraining layer to sinter the base layer and a second firing sub-step of firing at an oxygen partial pressure greater than that of the first firing sub-step such that the burnable material included in the constraining layer burns off.

9 Claims, 2 Drawing Sheets

U.S. PATENT DOCUMENTS

2005/0213283 A1* 9/2005 Nakano et al. ............ 361/321.4
2005/0230028 A1* 10/2005 Iwase et al. .............. 156/89.11

FOREIGN PATENT DOCUMENTS

| JP | 59-107980 A | 6/1984 |
|---|---|---|
| JP | 04-243978 A | 9/1992 |
| JP | 10-95677 A | 4/1998 |
| JP | 10095677 A1 * | 4/1998 |
| JP | 2001-291959 A | 10/2001 |
| JP | 2004-323306 A | 11/2004 |

OTHER PUBLICATIONS

Official Communication issued in corresponding European Patent Application No. 07791260.8, mailed on Apr. 14, 2010.

* cited by examiner

METHOD FOR PRODUCING CERAMIC COMPACT

BACKGROUND OF THE INVENTION

1. Field of the Invention

The present invention relates to methods for producing ceramic compacts, such as ceramic substrates, and particularly to a method for producing a ceramic compact, such as a ceramic substrate, obtained through a constraint firing step in which an unfired body is attached to a constraining layer and then fired such that the transverse shrinkage of the unfired body is prevented.

2. Description of the Related Art

Ceramic electronic components, particularly ceramic substrates, must have high two dimensional accuracy. The transverse shrinkage of the ceramic electronic components fired in firing steps and the variations in shrinkage seriously affect product quality.

There are some methods in which ceramic compacts are fired so as to prevent shrinking in firing steps. For example, the following method has been disclosed: a firing method (hereinafter referred to as constraint firing) in which a ceramic compact 51 is fired so as to substantially prevent transverse shrinkage by covering both principal surfaces of the ceramic compact 51 with constraining layers 52a and 52b primarily including a sintering resistant material, such as alumina as shown in FIG. 4, such that the sintering-resistant material is substantially sintered at the firing temperature of the ceramic compact 51 (see, for example, Japanese Unexamined Patent Application Publication No. 4-243978).

In the conventional firing method, the constraining layers, which are not sintered and remain on the ceramic compact 51, must be physically or mechanically removed by wet blasting or another suitable process after the firing step is completed. This causes a problem in that the production steps are complicated.

Since recent electronic components are compact and thus require thin ceramic substrates and elements, there is a problem in that if the conventional firing method is used to produce a multilayer ceramic substrate, the substrate may crack during a step of removing constraining layers.

SUMMARY OF THE INVENTION

To overcome the problems described above, preferred embodiments of the present invention provide a method for securely and efficiently producing a ceramic compact having outstanding dimensional accuracy. In the method, no constraining layer needs to be removed after the firing step is completed, the production steps are simplified, and a fired body is prevented from cracking in a step of removing a constraining layer.

A method for producing a ceramic compact according to a preferred embodiment of the present invention includes a laminate-preparing step of preparing an unfired laminate including a base layer including a ceramic powder and a glass material and a constraining layer that is in contact with at least one principal surface of the base layer and that primarily includes a burnable material which does not burn off when the burnable material is fired in a low-oxygen atmosphere, but which burns off when the burnable material is fired at an oxygen partial pressure greater than that of the low-oxygen atmosphere and also includes a firing step of firing the unfired laminate to sinter the base layer. The firing step includes a first firing sub-step of firing the laminate including the constraining layer to sinter the base layer and a second firing sub-step of performing firing at an oxygen partial pressure greater than that of the first firing sub-step such that the burnable material included in the constraining layer burns off.

The ceramic compact is preferably a ceramic substrate.

Firing is preferably performed in the first firing sub-step such that the glass material included in the base layer penetrates the constraining layer.

The burnable material is preferably a carbon powder.

The base layer preferably includes a binder, the method preferably further includes a degreasing step of removing the binder from the base layer, and the degreasing step is preferably prior to the first firing sub-step of the firing step and is performed in an oxygen-containing atmosphere at a temperature at which the burnable material does not burn off.

The constraining layer is preferably formed in the laminate-preparing step such that a sheet primarily including the burnable material is provided on at least one principal surface of the base layer.

Alternatively, the constraining layer may be formed in the laminate-preparing step such that a paste primarily including the burnable material is applied on at least one principal surface of the base layer.

The base layer preferably has a multilayer structure including sub-layers including the ceramic powder and the glass material.

The base layer preferably has a wiring pattern disposed on at least one principal surface thereof.

The method for producing a ceramic compact according to this preferred embodiment preferably further including a step of mounting an electronic component on an outer surface of the base layer fired in the firing step.

The constraining layer, which primarily includes the burnable material which does not burn off when the burnable material is fired in a low-oxygen atmosphere but which burns off when the burnable material is fired at an oxygen partial pressure greater than that of the low-oxygen atmosphere, is preferably used. After firing is performed in the low-oxygen atmosphere in the first firing sub-step such that the base layer is sintered without producing transverse shrinkage of the base layer, the burnable material included in the constraining layer can burn off in the second firing sub-step such that firing is performed at an oxygen partial pressure greater than that of the first firing sub-step. Thus, the constraining layer can be substantially removed in the firing step. Unlike the method which is disclosed in Japanese Unexamined Patent Application Publication No. 4-243978 in which constraint firing is performed, the method according to preferred embodiments of the present invention requires no step of removing the constraining layer by a physical or mechanical process, such as a wet blasting process, after the completion of the firing step, and thus, the steps of the method are simplified. Unlike the method in which constraint firing is performed using the conventional constraining layers, the method according to preferred embodiments of the present invention is effective to prevent a fired body from cracking or chipping in a constraining layer-removing step.

Therefore, according to preferred embodiments of the present invention, ceramic substrates having outstanding dimensional accuracy can be produced at a high yield.

In the ceramic compact-producing method according to preferred embodiments of the present invention, the constraining layer has a bonding force to prevent the base layer from shrinking in the transverse direction (i.e., in a direction substantially parallel to a principal surface thereof) in the first firing sub-step. The bonding force thereof prevents the base layer from shrinking in the transverse direction thereof and allows the base layer to substantially shrink only in the thickness direction thereof. Therefore, a ceramic compact having outstanding two-dimensional accuracy can be produced.

The term "low-oxygen atmosphere" used herein means an atmosphere having an oxygen partial pressure considerably less than that of air, and more particularly, means an atmosphere that preferably has an oxygen partial pressure of, for example, about $10^{-2}$ atm or less, that is, the concentration of oxygen in the atmosphere is about 1% by volume or less, at atmospheric pressure.

The low-oxygen atmosphere preferably has an oxygen partial pressure of, for example, about $10^{-6}$ atm to about $10^{-3}$ atm, that is, an oxygen concentration of 0.0001% to 0.1% by volume, at atmospheric pressure.

In the second firing sub-step, a condition greater than the oxygen partial pressure of the first firing sub-step means an atmosphere having an oxygen partial pressure sufficient to allow the burnable material to burn off, and particularly means an atmosphere that has an oxygen partial pressure of, for example, at least about $10^{-1}$ atm, that is, the concentration of oxygen in this atmosphere is at least about 10% by volume, at atmospheric pressure. The concentration of oxygen in this atmosphere may be about 100% by volume but the upper limit of the oxygen concentration thereof is preferably equal to the oxygen concentration of air, that is, an oxygen partial pressure of about 0.21 atm, in order to reduce manufacturing costs.

Preferred embodiments of the present invention are suitable for a method for producing a ceramic substrate which preferably has outstanding two-dimensional accuracy and shape accuracy. The method is useful to efficiently produce a ceramic substrate having outstanding dimensional accuracy.

The glass material included in the base layer preferably penetrates the constraining layer in the first firing sub-step to form a permeation layer. This allows the constraining layer and the base layer to be securely bonded to each other with the permeation layer disposed therebetween. The permeation layer effectively minimizes or prevents the transverse shrinkage of the base layer in the first firing sub-step.

To achieve a bonding force, the glass material in the base layer preferably securely penetrates the constraining layer. Therefore, the constraining layer is preferably tightly attached to the base layer.

The carbon powder, which is the burnable material, does not burn or shrink in the first firing sub-step although the carbon powder is fired in the low-oxygen atmosphere. Thus, the carbon powder provides a function of preventing shrinkage of the base layer during firing. The carbon powder burns off when the carbon powder is fired at a high oxygen partial pressure in the second firing sub-step. Therefore, no step of removing the constraining layer needs to be performed after the completion of the second firing sub-step. Furthermore, various ceramic compacts, such as ceramic substrates, having outstanding dimensional accuracy can be efficiently produced.

The carbon powder preferably has a particle size of about 0.1 μm to about 100 μm, for example. When the particle size is about 100 μm or less, a large bonding force can be achieved. When the particle size is at least about 0.1 μm, the carbon powder readily burns off in the second firing sub-step. The carbon powder more preferably has a particle size of about 1 μm to about 5 μm, for example. When the particle size is about 5 μm or less, a bonding force can be securely achieved. When the particle size is at least about 1 μm, the carbon powder more readily burns off.

The degreasing step is preferably prior to the first firing sub-step of the firing step and is performed in the oxygen-containing atmosphere at a temperature at which the burnable material does not burn off. Thus, the binder included in the base layer can be securely removed in the degreasing step, so that the first firing sub-step, in which constraint firing is performed, and the second firing sub-step, in which the burnable material included in the constraining layer burns off, can be efficiently performed.

Examples of the oxygen-containing atmosphere, in which the degreasing step is performed, include air atmospheres and atmospheres containing inert gases and air. An air atmosphere having a high oxygen partial pressure is useful to efficiently remove the binder.

In preferred embodiments of the present invention, examples of a technique for forming the constraining layer include a technique in which the burnable material-containing sheet is prepared in advance and then provided on at least one principal surface of the base layer and a technique in which the burnable material-containing paste is applied onto at least one principal surface of the base layer.

In order to achieve a sufficient bonding force, the constraining layer is preferably tightly bonded to the base layer such that the glass material included in the base layer penetrates the constraining layer to securely form the permeation layer as described above. Where the constraining layer is formed such that a carbon sheet primarily including the carbon powder is deposited on the base layer, the carbon sheet is preferably pressed against the base layer. Where the constraining layer is formed such that a carbon paste primarily including the carbon powder is applied onto the base layer, the carbon paste is preferably pressurized such that the carbon paste adheres tightly to the base layer.

The base layer preferably has the multilayer structure. Thus, various ceramic compacts, such as ceramic substrates, having outstanding two-dimensional accuracy and shape accuracy can be efficiently produced.

The wiring pattern is preferably disposed on at least one principal surface of the base layer. Therefore, if a ceramic compact produced by this method is used, the ceramic compact, or a ceramic substrate, can be efficiently produced so as to have an electronic component disposed on an outer surface thereof such that the electronic component is provided on the base layer fired in the firing step.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
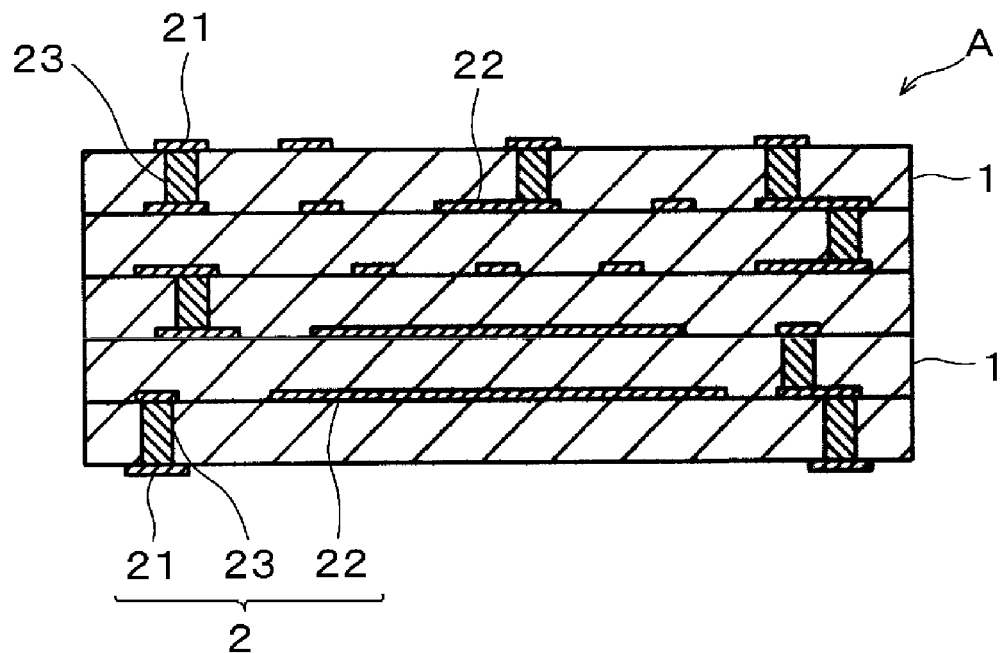
FIG. 1 is an illustration of a multilayer ceramic substrate produced by a method according to a first preferred embodiment of the present invention.

Preferred embodiments of the present invention will now be described with reference to the drawings.

(1) Constraining Layer

A constraining layer used in a method for producing a ceramic compact according to preferred embodiments of the present invention preferably includes the following two features:

(a) a constraining layer that maintains a function of preventing the shrinkage of a base layer until a low-temperature sinterable ceramic material included in the base layer is sintered, that is, until a first firing step of firing the base layer in a low-oxygen atmosphere is finished; and (b) the constraining layer burns off in a second firing step of firing the base layer at an oxygen partial pressure greater than that of the first firing step.

The constraining layer preferably includes a burnable material, for example, carbon powder.

The burnable material, such as carbon powder, preferably has properties enabling the constraining layer, which primarily includes the burnable material, to have a sufficient bonding force, that is, properties enabling the constraining layer to prevent shrinkage of the base layer in the first firing step.

The burnable material, which is included in the constraining layer, preferably has a high combustion temperature so as not to burn in the first firing step. When the burnable material has a high combustion temperature, the constraining layer can be securely degreased by increasing the heating temperature of the constraining layer in a degreasing step and a binder used can be selected from a wide variety of materials. The burnable material, such as carbon powder, preferably has a combustion temperature of at least about 600° C.

In order to enable the constraining layer to have a sufficient bonding force, the base layer preferably includes a glass material that penetrates the constraining layer to form a permeation layer. Therefore, the constraining layer is preferably securely attached to the base layer such that the glass material penetrates the constraining layer. Where the constraining layer is formed by depositing a constraining layer sheet on the base layer, the sheet is preferably pressed against the base layer. Where the constraining layer is formed by a coating process using a paste, the paste is preferably applied onto the base layer such that a printing tool is pressed against the base layer so as to be securely adhered thereto.

Carbon powder, which is an example of the burnable material, preferably has a particle size of about 1 μm to about 5 μm, for example. When the particle size thereof is about 5 μm or less, a large bonding force can be achieved. When the particle size thereof is at least about 1 μm or more, the carbon powder readily burns off in the second firing step.

The constraining layer is fired in an atmosphere which is supplied with air and which, therefore, has a high oxygen partial pressure in the second firing step subsequent to the first firing step, so that the constraining layer burns off. In order to readily burn off the constraining layer in the second firing step, the constraining layer is preferably formed of the carbon powder, the binder, and a solvent and the number of other additives used is preferably small.

(2) Degreasing Step

The degreasing step can usually be performed such that the constraining layer is heated from room temperature to the decomposition or combustion temperature of the binder in air and then maintained at this temperature for a predetermined period of time.

The constraining layer is preferably degreased such that the constraining layer is heated from room temperature to, for example, about 400° C. and then maintained at this temperature for about 60 minutes, for example.

In the ceramic compact-producing method according to preferred embodiments of the present invention, the degreasing step is preferably performed in an atmosphere, such as an air atmosphere, having a high oxygen partial pressure because high degreasing efficiency can be achieved under these conditions. However, the degreasing step may be performed at an oxygen partial pressure less than that of air. The degreasing step can be performed in a low-oxygen atmosphere having an oxygen partial pressure considerably less than that of air in some cases.

(3) Firing Conditions

After the degreasing step is completed, the first firing step is performed such that the base layer is heated to the sintering temperature thereof, for example, about 870° C. in an atmosphere supplied with nitrogen.

A low-oxygen atmosphere used in the first firing step is referred to as an atmosphere having an oxygen partial pressure that is less than that of air and preferably has an oxygen partial pressure of about $10^{-6}$ atm to about $10^{-3}$ atm because the base layer can be effectively constrained without causing the constraining layer to burn off.

After the first firing step is completed, the second firing step is preferably performed such that the constraining layer is fired in an atmosphere supplied with air. The constraining layer is preferably fired for about ten minutes in a temperature range from room temperature to, for example, about 780° C. This allows the constraining layer to burn off.

The first and second firing steps may be performed at different temperatures as described above or at the same temperature. The first and second firing steps may be continuously performed. Alternatively, after the first firing step is completed, the second firing step may be performed such that the base layer and the constraining layer are removed from a furnace and then placed into the furnace again.

Features of the present invention will now be described in detail with reference to specific preferred embodiments of the present invention.

First Preferred Embodiment

Figure 2:
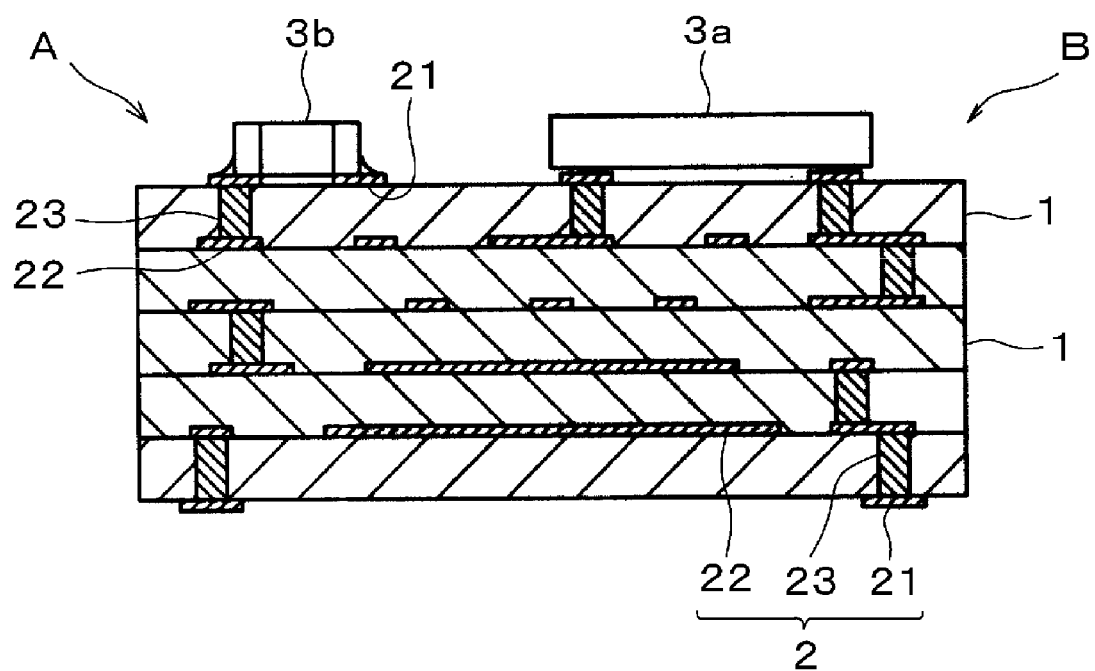
FIG. 2 is an illustration in which surface-mounted components are disposed on the ceramic substrate shown in FIG. 1.
Figure 3:
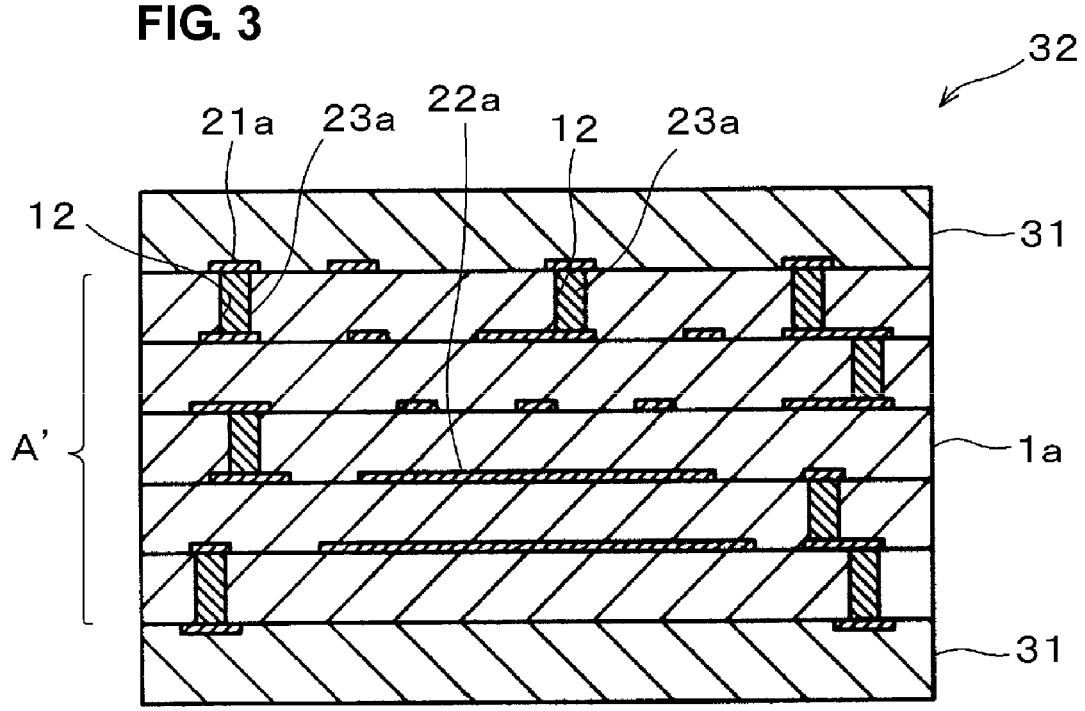
FIG. 3 is an illustration of an unfired laminate including constraining layers prepared in a step of the method for producing the ceramic substrate shown in FIGS. 1 and 2.
Figure 4:
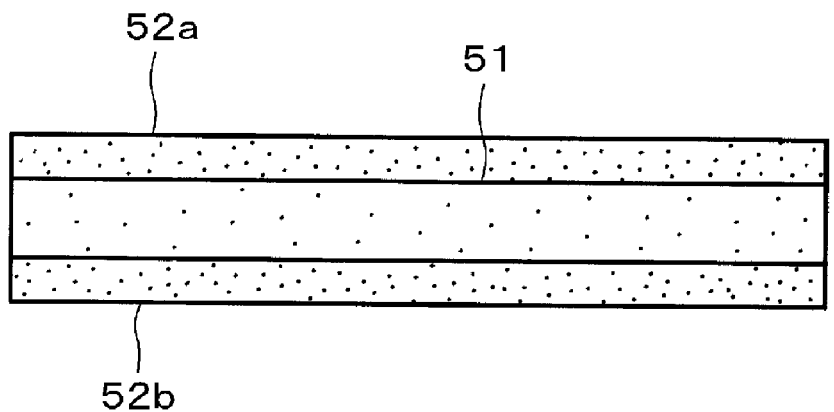
FIG. 4 is an illustration of a conventional method for constraint-firing a ceramic compact using constraining layers principally containing a sintering-resistant material.

FIG. 1 is an illustration of a multilayer ceramic substrate produced by a method according to a first preferred embodiment of the present invention. FIG. 2 is an illustration in which surface-mounted components are disposed on the ceramic substrate shown in FIG. 1. FIG. 3 is an illustration of an unfired laminate including constraining layers prepared in a step of the method for producing the ceramic substrate shown in FIGS. 1 and 2.

The ceramic substrate A shown in FIG. 1 includes insulating ceramic layers 1 formed by firing a low temperature-sinterable ceramic composition including a ceramic powder and a glass material and includes conductive sections 2 attached to the insulating ceramic layers 1. The ceramic substrate A is a multilayer substrate having a multilayer structure in which a number of the insulating ceramic layers 1 are stacked.

The low-temperature sinterable ceramic composition, which is used to form the insulating ceramic layers 1, includes, for example, an aluminum-based ceramic powder and a borosilicate glass-based glass powder.

The conductive sections 2 include external conductors 21 located on the ceramic substrate A, internal conductors 22 disposed between the insulating ceramic layers 1 bonded to each other, and via-hole conductors 23 connecting the interlayer conductors 22 to each other or connecting the surface conductors 21 to the interlayer conductors 22.

The surface conductors 21 and the interlayer conductors 22 are formed by firing external conductive layers and internal conductive layers, respectively, formed from a conductive paste, for example, a silver-containing conductive paste, by printing. The via-hole conductors 23 are formed such that a conductive paste or a conductive powder is filled in via-holes and then fired.

The multilayer ceramic substrate B shown in FIG. 2 includes surface-mounted electronic components 3a and 3b, such as semiconductor elements or chip capacitors, disposed on the multilayer ceramic substrate A shown in FIG. 1.

A method for producing the multilayer ceramic substrates A and B will now be described.

The method is described below with reference to FIGS. 1 to 3.

Appropriate amounts of a binder, a dispersant, a plasticizer, and other additives are added to a powder mixture prepared by mixing a ceramic powder and a glass material. These components are mixed into a ceramic slurry.

The ceramic powder can be selected from various powders and may be, for example, an alumina powder.

The glass material may include a glass powder or may form glassy precipitates in a firing step. Alternatively, the glass material may form crystalline precipitates in the final stage of the firing step, thereby causing crystallization. The glass material is preferably a borosilicate-based glass powder that can form crystalline precipitates of, for example, forsterite, akermanite, or diopside, which have low dielectric loss.

The ceramic slurry is formed into sheets by a doctor blade process or other suitable process, whereby substrate ceramic green sheets 1a (FIG. 3) are prepared.

Through-holes 12 (FIG. 3) for the via-hole conductors are formed in the substrate ceramic green sheets 1a as required. The conductive paste or the conductive powder is filled into the Through-holes 12, whereby unsintered via-hole conductors 23a (FIG. 3) are formed. In the first preferred embodiment of the present invention, the conductive paste is filled into the through-holes 12.

For example, a silver-containing conductive paste is applied onto the substrate ceramic green sheets 1a by printing as required, whereby unsintered surface conductors 21a and unsintered internal conductors 22a are formed (see FIG. 3).

Appropriate amounts of a binder, an organic solvent, and other additives are added to a burnable material that does not burn off in a predetermined low-oxygen atmosphere but burns off when the burnable material is fired at an oxygen partial pressure greater than that of the low-oxygen atmosphere. These components are mixed into a constraining layer slurry. This slurry is formed into sheets by a doctor blade process or other suitable process, whereby constraining layer green sheets are obtained.

The constraining layers may preferably be substantially identical to the constraining layer described above.

In particular, the burnable material is preferably, but not limited to, a carbon powder.

The constraining layers 31 preferably have a thickness of about 100 μm to about 200 μm, for example. This is because when the thickness thereof is at least about 100 μm, the constraining layers can function well independently. Alternatively, when the thickness thereof is about 200 μm or less, the sheets can be readily formed.

In this preferred embodiment, the constraining layer green sheets are prepared. However, for example, a paste including a carbon powder, a binder, and an organic solvent may be applied onto at least one principal surface of a base layer A', having a multilayer structure, shown in FIG. 3.

As shown in FIG. 3, the substrate ceramic green sheets 1a are stacked in a predetermined order and the constraining layers 31 are provided on principal surfaces of the base layer A', and then pressed against the principal surfaces thereof, whereby an unfired laminate 32 is provided which has the constraining layers 31 disposed on the upper and lower surfaces of the base layer A' (see FIG. 3).

The unfired laminate 32 may be cut so as to have an appropriate size as required.

In the first preferred embodiment, the base layer A' is preferably prepared by stacking the substrate ceramic green sheets 1a. However, the base layer A' may be prepared from one of the substrate ceramic green sheets 1a so as to have a single-layer structure and then processed into a single-plate ceramic substrate.

In the first preferred embodiment, the constraining layers 31 are preferably disposed on the upper and lower surfaces of the base layer A'. However, one of the constraining layers 31 may be disposed on only one of the principal surfaces of the base layer A'.

The unfired laminate 32 is fired in a low-oxygen atmosphere in which a low-temperature sinterable ceramic material included in the substrate ceramic green sheets 1a of the base layer A' is sintered and in which the burnable material included in the constraining layers 31 does not burn off and functions to prevent the transverse shrinkage of the base layer A', whereby the unfired base layer is sintered. The constraining layers 31 are fired at an oxygen partial pressure greater than that of the first firing step such that the burnable material included in the constraining layers 31 burns off.

This produces a ceramic substrate A having the configuration shown in FIG. 1.

EXAMPLE

About eight parts by weight of a binder, about one part by weight of a dispersant, about three parts by weight of a plasticizer, and about 80 parts by weight of an organic solvent were added to about 100 parts by weight of a powder mixture prepared by mixing about 48% by weight of a ceramic powder and about 52% by weight of a glass powder. These components were mixed into a ceramic slurry.

In this example, the ceramic powder was an alumina ($Al_2O_3$) powder and the glass powder was a borosilicate glass powder.

The ceramic slurry was formed into sheets by a doctor blade process, whereby substrate ceramic green sheets 1a (see FIG. 3) having a thickness of about 50 μm were prepared.

Through-holes 12 for via-hole conductors were formed in the substrate ceramic green sheets 1a. A silver-containing conductive paste was filled into the through-holes 12, whereby via-hole conductors 23a were formed.

The silver-containing conductive paste was applied on the substrate ceramic green sheets by printing, whereby unsintered surface conductors 21a and unsintered internal conductors 22a were formed.

To about 100 parts by weight of a carbon powder with a particle size of about 2 μm, about 12 parts by weight of a binder, about one part by weight of a dispersant, about four parts by weight of a plasticizer, and about 100 parts by weight of an organic solvent were added. These components were mixed into a constraining layer slurry. The constraining layer slurry was formed into sheets by a doctor blade process, whereby constraining layers with a thickness of about 100 μm were produced.

Ten of the substrate ceramic green sheets 1a were arranged in a predetermined order. The constraining layers 31 were provided on the upper and lower surfaces of a laminate including the substrate ceramic green sheets and then pressed against the laminate, whereby an unfired laminate 32 was prepared.

The unfired laminate was heated from room temperature to about 400° C. at a rate of about 1° C./min in air and then maintained at this temperature for about one hour, whereby the unfired laminate was degreased. The unfired laminate was heated from about 400° C. to about 870° C. at a rate of about 1° C./min in an atmosphere, supplied with nitrogen, having an oxygen partial pressure of about $10^{-5}$ atm and then maintained at about 870° C. for about ten minutes.

The atmosphere was supplied with air at atmospheric pressure and maintained at an oxygen partial pressure of about 0.21 atm for about ten minutes such that the constraining layers 31 are burned off, whereby a ceramic substrate A having the configuration shown in FIG. 1 was obtained.

In the first preferred embodiment, in order to produce the ceramic substrate through a constraint firing step, the constraining layers are used. The constraining layers primarily include the burnable material, which does not burn off when the burnable material is fired in the low-oxygen atmosphere but burns off when the burnable material is fired at an oxygen partial pressure greater than that of the low oxygen atmosphere. In the first firing step, constraint firing is performed in the low-oxygen atmosphere such that the base layer is sintered. In the second firing step, firing is performed at an oxygen partial pressure greater than that of the first firing step such that the burnable material included in the constraining layers burns off. Unlike the method disclosed in Japanese Unexamined Patent Application Publication No. 4-243978 in which constraint firing is performed using the constraining layers primarily including the sintering-resistant ceramic material, the method according to the first preferred embodiment of the present invention requires no step of removing the constraining layers by a physical or mechanical process, such as a wet blasting process after the completion of the firing steps and is effective in preventing a fired body from cracking or chipping in a constraining layer-removing step. Therefore, according to preferred embodiments of the present invention, ceramic substrates having outstanding dimensional accuracy can be produced at high yield.

In the first preferred embodiment of the present invention, the production of a ceramic compact is described using the ceramic substrate as an example. However, preferred embodiments of the present invention are not limited to the ceramic substrate and can be applied to methods for producing various ceramic compacts including ceramic electronic components, such as ceramic coil components and ceramic LC composite components.

The present invention is not limited to the above-described preferred embodiments. The following items may be modified or varied within the scope of the present invention: the types and mixing ratio of a ceramic powder and glass material used to form a base layer, the type of burnable material used to form a constraining layer, conditions of a first and a second firing step, and conditions of a degreasing step.

As described above, according to preferred embodiments of the present invention, a ceramic compact having outstanding two-dimensional accuracy can be efficiently produced without performing a step of removing a constraining layer after a firing step and without performing any complicated steps.

Accordingly, the present invention can be used to produce a wide variety of ceramic compacts through firing steps.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a ceramic compact, comprising:
    a laminate-preparing step of preparing an unfired laminate including a base layer and a constraining layer, the base layer including a ceramic powder and a glass material, and the constraining layer being arranged in contact with at least one principal surface of the base layer and primarily including a burnable material which does not burn off when the burnable material is fired in a low-oxygen atmosphere but which burns off when the burnable material is fired at an oxygen partial pressure greater than that of the low-oxygen atmosphere; and
    a firing step of firing the unfired laminate to sinter the base layer; wherein
    the firing step includes a first firing sub-step of firing the laminate including the constraining layer to sinter the base layer and a second firing sub-step of firing at an oxygen partial pressure greater than that of the first firing sub-step such that the constraining layer burns off;
    the burnable material is a carbon powder; and
    the carbon powder has a particle size of about 1 μm to about 5 μm.

2. The ceramic compact-producing method according to claim 1, wherein the ceramic compact is a ceramic substrate.

3. The ceramic compact-producing method according to claim 2, wherein firing is performed in the first firing sub-step such that the glass material included in the base layer penetrates the constraining layer.

4. The ceramic compact-producing method according to claim 1, wherein the base layer includes a binder, and the method further comprising a degreasing step of removing the binder from the base layer, the degreasing step being performed prior to the first firing sub-step of the firing step and in an oxygen-containing atmosphere at a temperature at which the burnable material does not burn off.

5. The ceramic compact-producing method according to claim 1, wherein the constraining layer is formed in the laminate-preparing step such that a sheet primarily including the burnable material is provided on the at least one principal surface of the base layer.

6. The ceramic compact-producing method according to claim 1, wherein the constraining layer is formed in the laminate-preparing step such that a paste primarily including the burnable material is applied on the at least one principal surface of the base layer.

7. The ceramic compact-producing method according to claim 1, wherein the base layer has a multilayer structure including sub-layers including the ceramic powder and the glass material.

8. The ceramic compact-producing method according to claim 1, wherein the base layer includes a wiring pattern disposed on at least one principal surface thereof.

9. The ceramic compact-producing method according to claim 1, further comprising a step of mounting an electronic component on an outer surface of the base layer fired in the firing step.

\* \* \* \* \*